United States Patent
Park et al.

(10) Patent No.: US 9,148,165 B2
(45) Date of Patent: Sep. 29, 2015

(54) WHEEL DRIVER AND PORTABLE ELECTRONIC DEVICE HAVING THE SAME

(75) Inventors: Seong-Ha Park, Suwon-si (KR); Chul Park, Seongnam-si (KR); Seung-Jun Kim, Suwon-si (KR); Joong-Wan Park, Suwon-si (KR); Sung-Won Kim, Suwon-si (KR)

(73) Assignees: Samsung Electronics Co., Ltd (KR); GNC Co., Ltd (KR)

( * ) Notice: Subject to any disclaimer, the term of this patent is extended or adjusted under 35 U.S.C. 154(b) by 1222 days.

(21) Appl. No.: 12/615,030

(22) Filed: Nov. 9, 2009

(65) Prior Publication Data

US 2010/0117995 A1  May 13, 2010

(30) Foreign Application Priority Data

Nov. 7, 2008  (KR) .................. 10-2008-0110676

(51) Int. Cl.
*G09G 5/00* (2006.01)
*H03M 1/28* (2006.01)
*G01D 5/245* (2006.01)
*G01D 5/347* (2006.01)
*G06F 3/03* (2006.01)
*G06F 3/0362* (2013.01)

(52) U.S. Cl.
CPC ............ *H03M 1/287* (2013.01); *G01D 5/2451* (2013.01); *G01D 5/34715* (2013.01); *G06F 3/0317* (2013.01); *G06F 3/0362* (2013.01)

(58) Field of Classification Search
USPC ........................................ 345/184, 156–157
See application file for complete search history.

(56) References Cited

U.S. PATENT DOCUMENTS

| | | | |
|---|---|---|---|
| 5,130,536 A * | 7/1992 | Sato et al. | 250/231.17 |
| 6,642,919 B1 * | 11/2003 | Jaeger et al. | 345/161 |
| 7,645,026 B2 | 1/2010 | Silverbrook | |
| 2004/0021078 A1 * | 2/2004 | Hagler | 250/339.13 |
| 2006/0000966 A1 * | 1/2006 | Doe | 250/221 |
| 2007/0272840 A1 * | 11/2007 | Musha et al. | 250/231.13 |
| 2008/0099669 A1 * | 5/2008 | Lum et al. | 250/230 |

FOREIGN PATENT DOCUMENTS

KR  1020080039814  5/2008

* cited by examiner

*Primary Examiner* — William Boddie
*Assistant Examiner* — Leonid Shapiro
(74) *Attorney, Agent, or Firm* — The Farrell Law Firm, P.C.

(57) ABSTRACT

A pattern wheel driver is provided. The pattern wheel driver includes a rotatable pattern wheel with patterned regions repeatedly formed on the pattern wheel. Each of the patterned regions has a plurality of patterns. Each of the plurality of patterns has a different width. The pattern wheel driver also includes a detector for detecting the plurality of patterns, mounted at a position where the patterned regions of the pattern wheel pass when the pattern wheel rotates. The pattern wheel driver also includes an encoder for producing a signal indicating whether the pattern wheel rotates in a forward direction or a reverse direction based on signals produced by the detector.

11 Claims, 8 Drawing Sheets

FIG.7C ured on Nov. 7, 2008 and assigned Serial No.
WHEEL DRIVER AND PORTABLE ELECTRONIC DEVICE HAVING THE SAME

PRIORITY

This application claims priority under 35 U.S.C. §119(a) to an application entitled "Wheel Driver and Portable Electronic Device Having the Same" filed in the Korean Intellectual Property Office on Nov. 7, 2008 and assigned Serial No. 10-2008-0110676, the content of which is incorporated herein by reference.

BACKGROUND OF THE INVENTION

1. Field of the Invention

The present invention relates generally to a wheel driver, and more particularly, to a wheel driver in a portable electronic device.

2. Description of the Related Art

A jog wheel allows a user to reproduce audio or video content. Recently, jog wheels have been employed as interfaces for menu selection on portable terminals, such as portable phones, music players, or Personal Digital Assistants (PDAs). For example, jog wheels are used for scrolling menu entries on a portable terminal, or for controlling the movement of a mouse pointer displayed on the portable terminal.

Typically, jog wheels have been implemented with electrical capacitive sensing or magnetic sensing. In such cases, it is necessary to provide one or more sensors (e.g., hall sensors) for sensing an electrical capacitive circuit or magnetic field around the jog wheel. Consequently, if such a jog wheel is applied to a portable terminal, the size (or thickness) of the portable terminal would increase.

Figure 1:
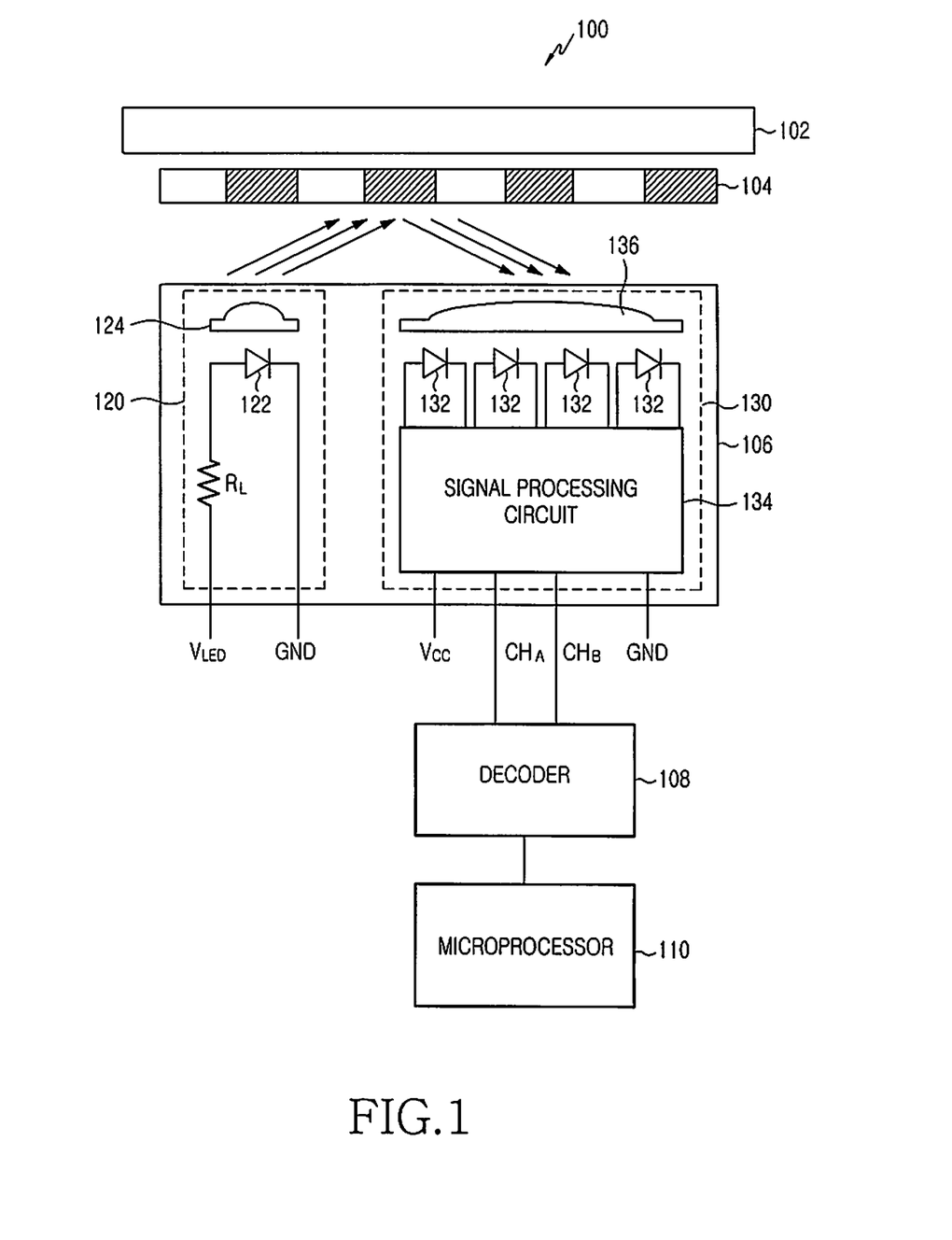
FIG. 1 is a diagram illustrating a circuit of a conventional optical jog wheel.
Figure 2:
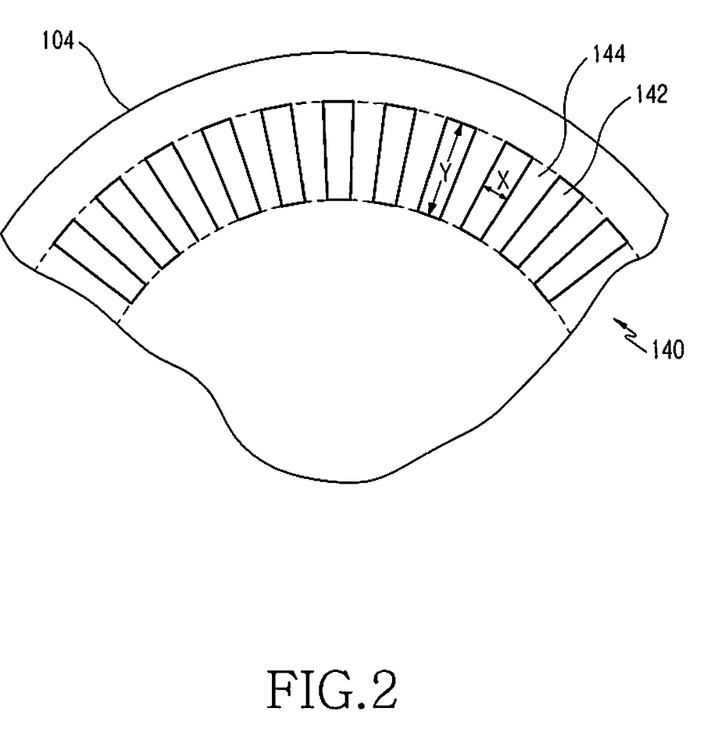
FIG. 2 is a diagram illustrating a code wheel of the jog wheel shown in FIG. 1.

Korean Patent Publication No. 10-2008-0039814 entitled "User Navigation Device and Method of Producing the Same" has proposed a jog wheel which attempts to solve the problem of resulting increased portable terminal size. FIG. 1 illustrates a circuit of an optical reflective jog wheel, and FIG. 2 illustrates a code wheel provided in the circuit of FIG. 1. The optical jog wheel 100, shown in FIG. 1, includes a turn dial 102, a pattern wheel 104, an encoder 106, a decoder 108, and a microprocessor 110. The turn dial 102 is physically coupled to the pattern wheel 104. If a user manually rotates the turn dial 102, the pattern wheel 104 is rotated. As shown in FIG. 2, reflective sections 144 and non-reflective sections 142, which are the same in width, are alternately and repeatedly provided on the pattern wheel 104.

The encoder 106 includes an emitter 120 and a detector 130. The emitter 120 includes a light source 122, such as a Light Emitting Diode (LED), and the detector 130 includes one or more optical detectors 132, such as a photodiode. Signals produced by the photodiodes 132 are processed by a signal processing circuit 134 for producing channel signals $CH_A$ and $CH_B$.

Figure 3A:
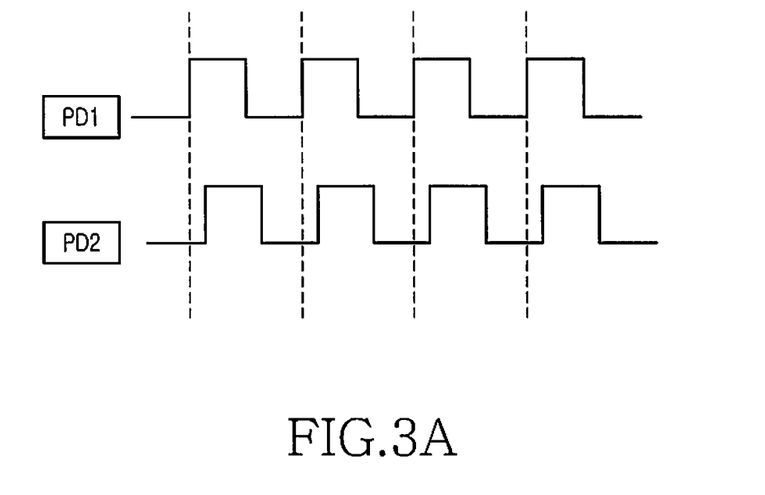
FIG. 3A is timing diagram illustrating the signals produced by photodiodes in response to the counterclockwise rotation of the conventional jog wheel.
Figure 3B:
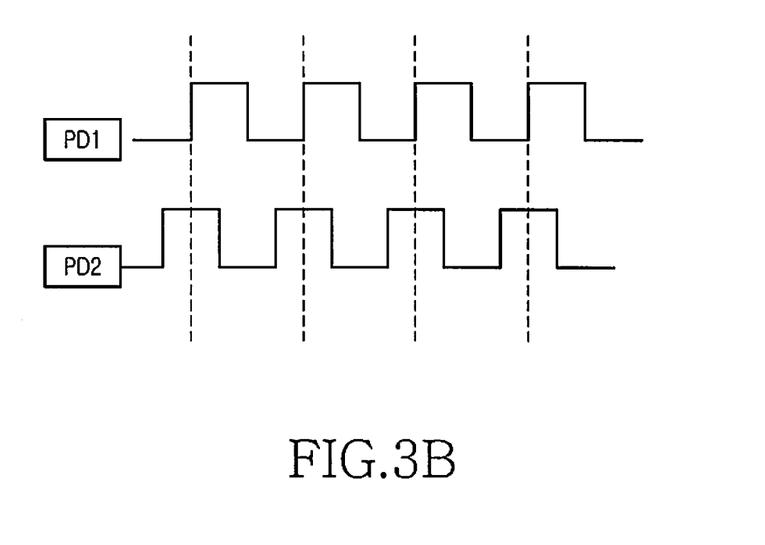
FIG. 3B is a timing diagram illustrating the signals produced by the photodiodes in response to the clockwise rotation of the conventional jog wheel.

FIG. 3A illustrates signals produced by the photodiodes 132 when the code wheel rotates counterclockwise, and FIG. 3B illustrates signals produced by the photodiodes when the code wheel rotates clockwise. Referring to FIGS. 3A and 3B, a first photodiode inputs a reference signal for confirming direction, and a second photodiode inputs a signal at a different timing. The signal input by the second photodiode is input differently depending on the rotating direction of the code wheel. The signal processing circuit 134 determines the rotating direction of the pattern wheel 104 by confirming the timing of the signal input by the second photodiode with reference to the signal input through the first photodiode.

Consequently, the above-described conventional optical reflective jog wheel requires at least two photodiodes. In addition, its response time is poor because the rotating direction of the pattern wheel 104 is determined after the signals input through the two photodiodes are confirmed.

SUMMARY OF THE INVENTION

The present invention has been made to address the above problems and/or disadvantages and to provide at least the advantages described below. Accordingly, an aspect of the present invention provides a wheel driver which employs only one detector so as to quickly and correctly detect the moving direction of a pattern wheel, and a portable electronic device having such a wheel driver.

According to an aspect of the present invention, a pattern wheel driver is provided that includes a rotatable pattern wheel with patterned regions repeatedly formed on the pattern wheel. Each of the patterned regions has a plurality of patterns, and each of the plurality of patterns has a different width. The wheel driver also includes a detector for detecting the plurality of patterns, which is mounted at a position where the patterned regions of the pattern wheel pass when the pattern wheel rotates. The wheel driver further includes an encoder for producing a signal indicating whether the pattern wheel rotates in a forward direction or a reverse direction based on signals produced by the detector.

The plurality of patterns may be formed by reflective sections which reflect light, and non-reflective sections which do not reflect light. The reflective sections and the non-reflective sections are alternately arranged. The detector may include a light source for emitting light toward the patterned regions, and a light receiving part for detecting light reflected from the patterned regions.

Each of the patterned regions may have at least three reflective sections and/or non-reflective sections having differing widths.

The pattern wheel driver may further include a turn dial, coupled to the pattern wheel. Further, the pattern wheel driver may further include a housing assembly for rotatably mounting the turn dial. The detector may be fixed in the housing assembly so that it can detect the patterned regions of the pattern wheel.

According to another aspect of the present invention, a portable electronic device is provided that includes a pattern wheel driver and a microprocessor for displaying information on a display based on a signal received from an encoder. The pattern wheel driver includes a rotatable pattern wheel with patterned regions repeatedly formed on the pattern wheel. Each of the patterned regions has a plurality of patterns, and each of the plurality of patterns has a different width. The pattern wheel driver also includes a detector for detecting the plurality of patterns, which is mounted at a position where the patterned regions of the pattern wheel pass when the pattern wheel rotates. The pattern wheel driver further includes the encoder for producing the signal indicating whether the pattern wheel rotates in a forward direction or a reverse direction based on signals produced by the detector. Additionally, the pattern wheel driver includes a housing assembly for rotatably mounting the turn dial. The detector is fixed in the housing assembly so that it can detect the patterned regions of the pattern wheel.

The information displayed on the display may include at least one of a menu, a mouse pointer, and voice and image contents, which are provided by an operation system program of the portable electronic device.

BRIEF DESCRIPTION OF THE DRAWINGS

The above and other aspects, features and advantages of the present invention will be more apparent from the following detailed description when taken in conjunction with the accompanying drawings, in which.

DETAILED DESCRIPTION OF EMBODIMENTS OF THE PRESENT INVENTION

Embodiments of the present invention are described in detail with reference to the accompanying drawings. It should be noted that the same or similar components are designated by the same or similar reference numerals although they are illustrated in different drawings. Detailed descriptions of constructions or processes known in the art may be omitted to avoid obscuring the subject matter of the present invention.

Figure 4:
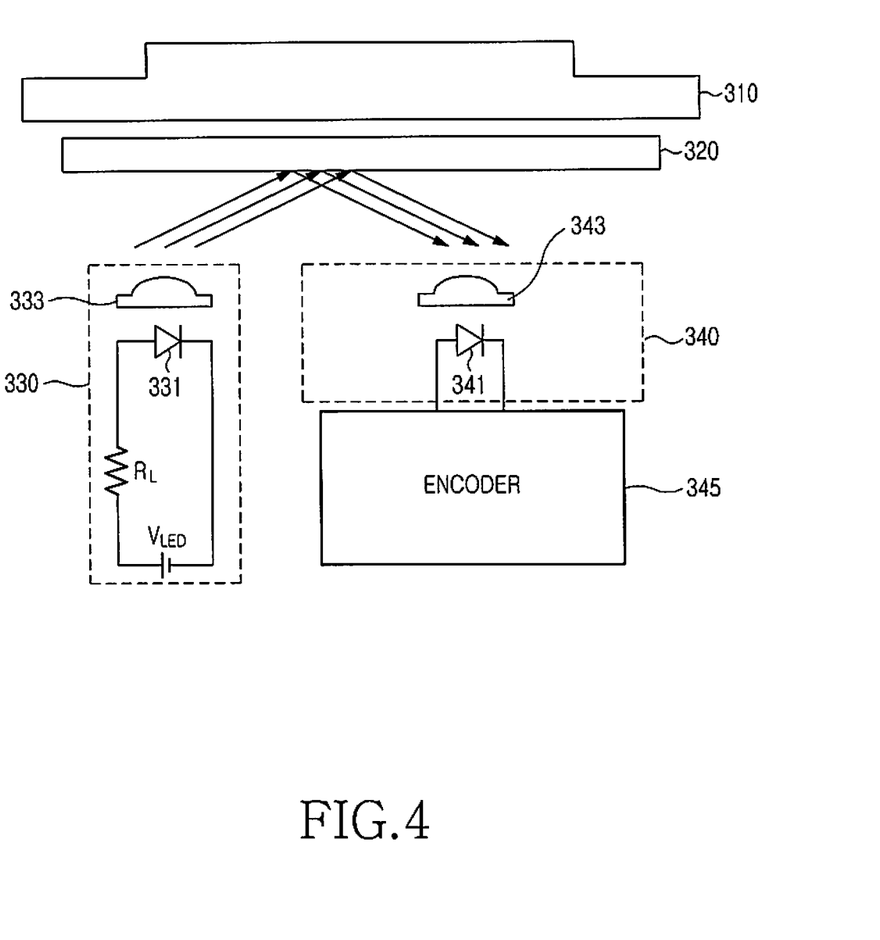
FIG. 4 is a diagram illustrating the construction of a pattern wheel driver, according to an embodiment of the present invention.

FIG. 4 is a diagram illustrating a construction of a pattern wheel driver, according to an embodiment of the present invention. Referring to FIG. 4, the pattern wheel driver, according to an embodiment of the present invention, includes a turn dial 310, a pattern wheel 320, a light source 330, a detector 340, and an encoder 345.

The turn dial 310 is physically coupled to the pattern wheel 320. If a user manually rotates the turn dial 310, the pattern wheel 320 is rotated. The turn dial 310 may be a multi-turn dial which is capable of continuously rotating without interruption. Alternatively, the turn dial 310 may be a single-turn dial with a limited movement range of one turn (i.e., 360 degrees) or less.

The shape of the pattern wheel 320 corresponds to that of the employed turn dial 310. For example, the pattern wheel 320 may have a circular or ring type disk shape. The pattern wheel 320 includes tracks of reflective sections and non-reflective sections.

The light source 330 may include a device for producing light, such as a Light Emitting Diode (LED) 331. The light source 330 is positioned where the light source 330 is capable of emitting light toward the pattern wheel 320. As the turn dial 310 rotates, the light incident to the pattern wheel 320 is reflected from the reflective sections of the pattern wheel 320 but is not reflected from the non-reflective sections of the pattern wheel 320. Therefore, if the turn dial 310 rotates, the light produced through the light source 330 is selectively reflected in response to the pattern of reflective sections and non-reflective sections on the pattern wheel 320.

The detector 340 is a device for detecting light, which may include a photodiode 341, for example. The detector 340 is positioned where it can detect light selectively reflected by the pattern wheel 320. As the turn dial 310 rotates, the detector 320 detects the light reflected in response to the pattern of the pattern wheel 320.

The light source 330 may further include a lens 333 that directs the light projected from the LED 331 toward a specific path or pattern. For example, the lens 333 may focus light to a region where the reflective sections and the non-reflective sections of the pattern wheel are positioned. In addition, the detector 340 may further include a lens 343 for directing a reflected light signal to the photodiode 341.

In the above-mentioned embodiment of the present invention, the light source 330 includes an LED 331 and the detector 340 includes a photodiode 341. However, the present invention is not limited to this embodiment, and the light source and the detector may be employed in various modified forms.

A signal produced by the detector 340 is input to the encoder 345, which in turn outputs a signal indicating the rotation direction of the turn dial 310 in response to the pattern of the input signal.

Figure 5:
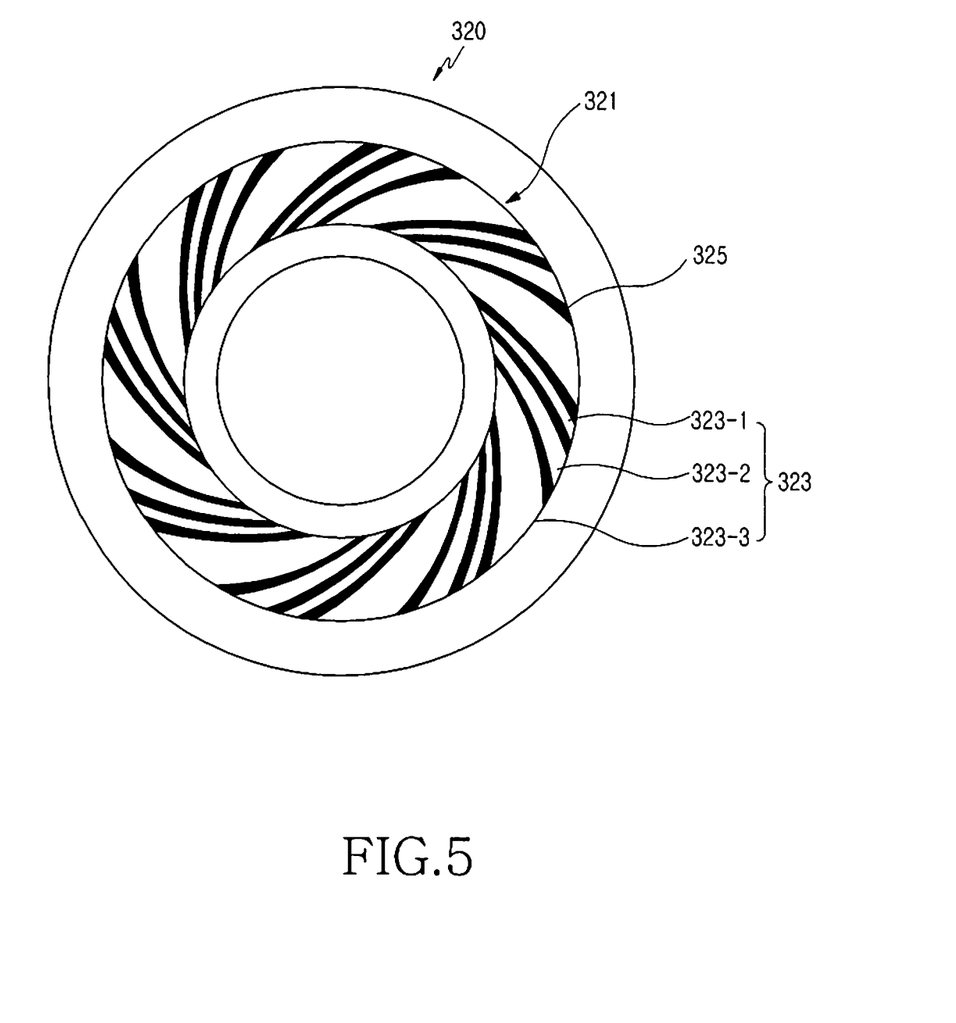
FIG. 5 is a diagram illustrating a top plan view of a pattern wheel 320, according to an embodiment of the present invention.

FIG. 5 is a diagram illustrating a top plan view of the pattern wheel 320, according to an embodiment of the present invention. Referring to FIG. 5, the pattern wheel 320 includes a track 321. Reflective sections 323 and non-reflective sections 325 are repeatedly formed along the track 321. The reflective sections 323 may be printed or coated with a reflective material, and the non-reflective sections 325 may be printed or coated with a light absorption material.

The present invention is not limited to the arrangement of the reflective sections 323 and non-reflective sections 325 as show in FIG. 5. For example, the reflective sections 323 may be opaque areas which are printed or coated with a reflective material, and the non-reflective sections 325 may be areas which are not additionally processed. In addition, the non-reflective sections 325 may be areas which are formed with holes on the pattern wheel.

The non-reflective sections 325 formed on the pattern wheel 320 are equal in width, while the reflective sections 323 have differing widths. For example, the reflective sections 323 include a first reflective section 323-1 having a width that is relatively narrowest of the reflective sections, a second reflective section 323-2 having a width that is relatively wider than that of the first reflective section, and a third reflective section 323-3 having a width that is relatively wider than both the first reflective section 323-1 and the second reflective section 323-3. In addition, the first, second and third reflective sections 323-1, 323-2 and 323-3, are sequentially and repeatedly provided on the area where the non-reflective sections are formed on the pattern wheel 320.

Figure 6A:
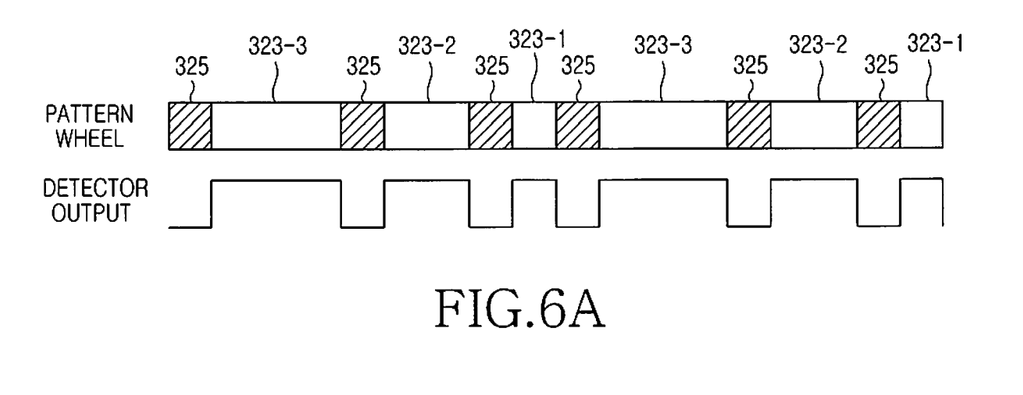
FIG. 6A is a timing diagram in the case in which a pattern wheel rotates counterclockwise, according to an embodiment of the present invention.
Figure 6B:
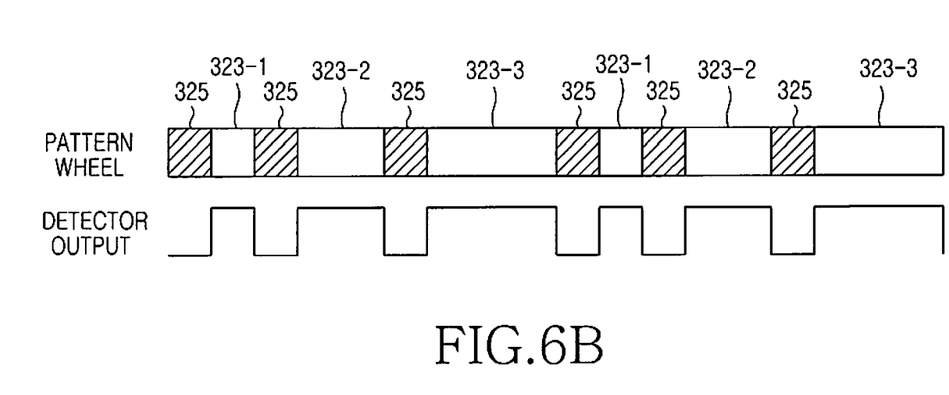
FIG. 6b is a timing diagram in the case in which the pattern wheel rotates clockwise, according to an embodiment of the present invention.

FIG. 6A is a timing diagram in the case in which the pattern wheel of the inventive pattern driver rotates counterclockwise, according to an embodiment of the present invention. FIG. 6B is a timing diagram in the case in which the pattern wheel of the inventive pattern driver rotates clockwise, according to an embodiment of the present invention. Referring to FIGS. 6A and 6B, if the pattern wheel 320 rotates, the non-reflective sections 325, which have the same widths as described above, absorb light incident from the light source 330. In particular, if the pattern wheel 320 rotates counter-clockwise, the first reflective section 323-1, the second reflective section 323-2, and the third reflective section 323-3 sequentially reflect the light incident from the light source 330. As a result, the detector 340 detects the light reflected in response to the first reflective section 323-1, the second reflective section 323-2, and the third reflective section 323-3, and transmits signals to the encoder 345. The signals indicate that light signals are detected for the spaces which correspond to the widths of the individual reflective sections 323-1, 323-2 and 323-3, respectively. If the pattern wheel 320 rotates clockwise, the third reflective section 323-3, the second reflective section 323-2, and the first reflective section 323-1 sequentially reflect the light incident from the light source 330. As a result, the detector 340 detects the light reflected in response to the third reflective section 323-3, the second reflective section 323-2, and the first reflective section 323-1, and transmits the signals to the encoder 345, wherein the signals indicate that the light signals are detected for the spaces which correspond to the widths of the individual reflective sections 323-1, 323-2 and 323-3, respectively.

The encoder 345 outputs a signal indicating the rotation direction of the pattern wheel in response to the pattern of signals input from the detector 340. For example, if the signals from the detector 340 are input in a sequence corresponding to the widths of the first reflective section 323-1, the second reflective section 323-2, and the third reflective section 323-3, the encoder 345 outputs a signal indicating that the pattern wheel 320 is rotating counter-clockwise. Whereas, if the signals from the detector 340 are input in a sequence corresponding to the widths of the third reflective section 323-3, the second reflective section 323-2, and the first reflective section 323-1, the encoder 345 outputs a signal indicating that the pattern wheel 320 is rotating clockwise.

The signal outputted from the encoder 345 and indicating the rotation direction of the pattern wheel 320 as described above may be transmitted to a microprocessor of a portable terminal (not shown) or the like, and the microprocessor may implement operations such as scrolling, menu selection, movement of a mouse pointer, etc. in response to the movement of the turn dial 310.

Alternatively, the reflective sections 323 may be equal in width while the non-reflective sections 325 have differing widths like the reflective sections 323 in the above-described embodiment.

In the above-described embodiment, the reflective sections 323 or the non-reflective sections 325 have at least three sections with different widths. However, the present invention is not limited to this. According to the present invention, it is sufficient if the widths of the reflective sections 323 and/or the non-reflective sections 325 are set to allow the rotation direction of the turn dial 310 to be confirmed.

Figure 7A:
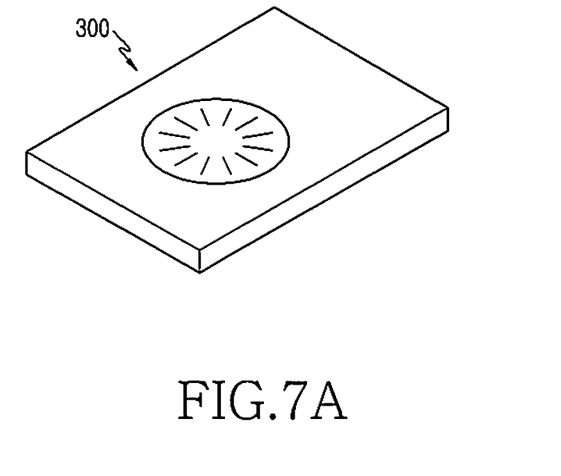
FIG. 7a is a diagram illustrating a perspective view of a pattern wheel driver, according to an embodiment of the present invention.
Figure 7B:
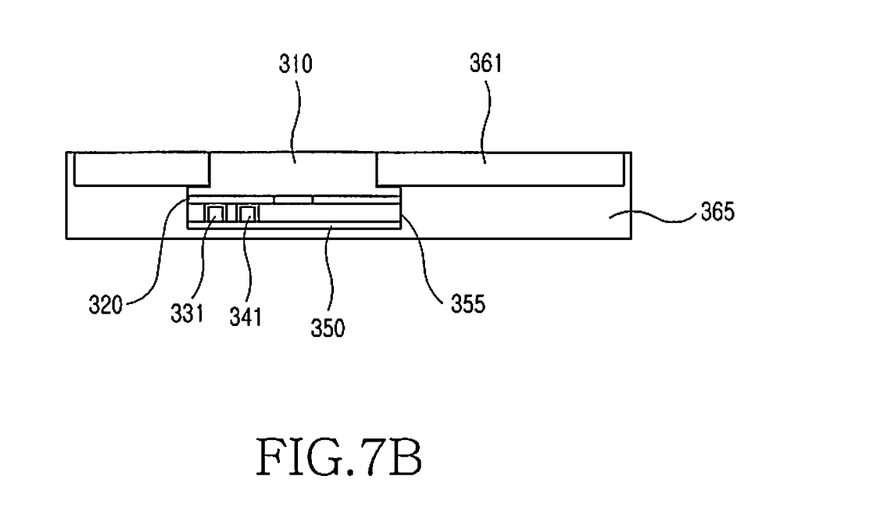
FIG. 7b is a diagram illustrating a side view of the pattern wheel driver partially in cross-section, according to an embodiment of the present invention.
Figure 7C:
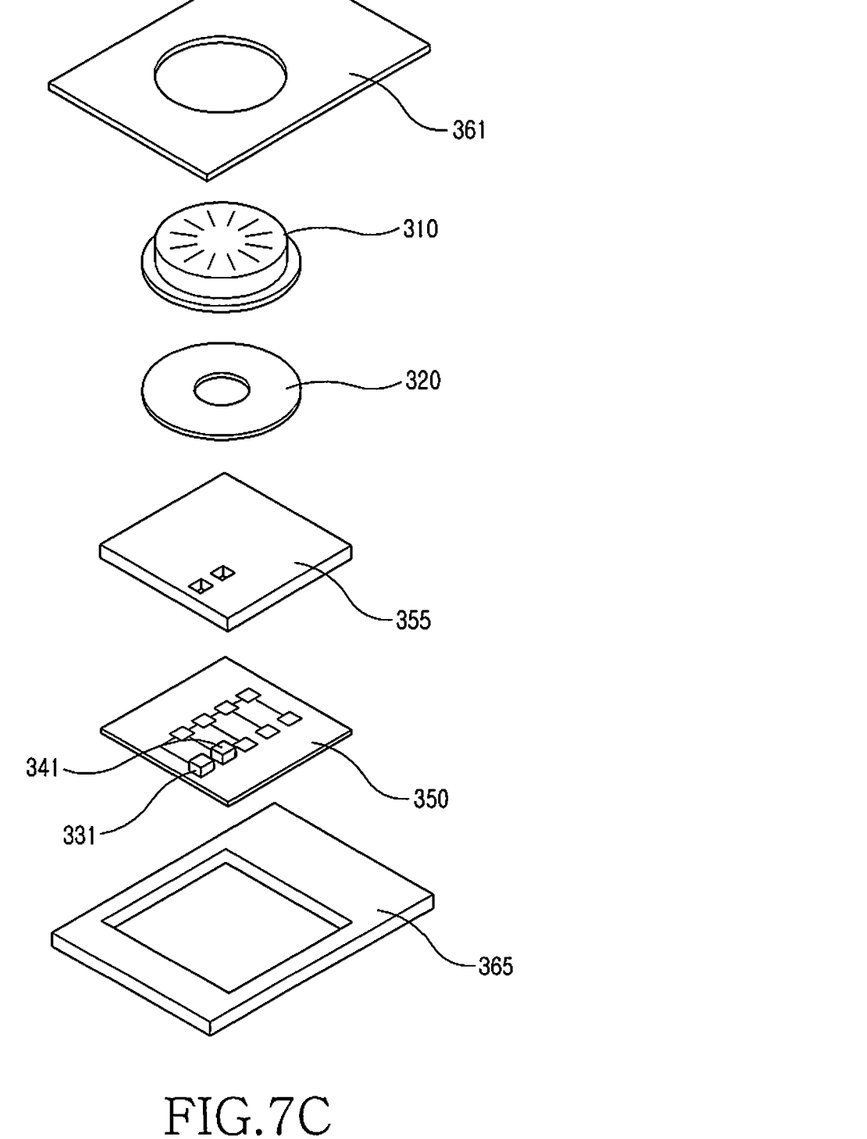
FIG. 7c is a diagram illustrating an exploded perspective view of the pattern wheel driver, according to an embodiment of the present invention.

FIG. 7A is a diagram illustrating a perspective view of a pattern wheel driver, according to an embodiment of the present invention. FIG. 7B is a diagram illustrating a side view of the pattern wheel driver partially in cross-section, according to an embodiment of the present invention. FIG. 7C is a diagram illustrating an exploded perspective view of the pattern wheel driver, according to an embodiment of the present invention.

Referring to FIGS. 7A, 7B and 7C, the pattern wheel driver 300 includes the turn dial 310, the pattern wheel 320, a circuit board 350, and a housing assembly. The LED 331 serving as the light source 330, the photodiode 341 serving as the detector 340, and the encoder 345 are mounted on the circuit board 350.

The turn dial 310 has a touch surface that allows a user to easily rotate the turn dial 310. For example, the turn dial 310 may be formed with an uneven or rough surface so that the user can easily handle the surface of the turn dial 310 by touching the surface. Because the pattern wheel 320 is coupled to the turn dial 310 as described above, the pattern wheel 320 rotates if the turn dial 310 rotates.

The circuit board 350 is employed so as to mount the LED 331 (for the light source 330), the photodiode 341 (for the detector 340), and the encoder 345. For example, the circuit board 350 may be a Printed Circuit Board (PCB), a flexible circuit, a lead frame, a glass substrate, a ceramic substrate, a Molded Interconnect Device (MID), or the like.

The housing assembly includes a top cover 361, a mounting bracket 355, and a base plate 365. The top cover 361 is formed with a circular hole, through which the turn dial 310 extends. The mounting bracket 355 is mounted on the bottom side of the turn dial 310, on which the pattern wheel 320 is coupled to the turn dial 310. The mounting bracket 355 is formed with holes, through which the LED 331 (for the light source 330) and the photodiode 341 (for the detector 340) extend, respectively. The base plate 365 has a receiving space, and the mounting bracket 355 and the circuit board 350 are fixedly fit in the receiving space. Consequently, the circuit board 350 and the mounting bracket 355 are sequentially fit in the receiving space and fixed therein, and the turn dial 310, to which the pattern wheel 320 is coupled, is mounted on the top of the mounting bracket 355. In addition, the top cover 361 is also mounted over the turn dial 310 in such a manner that the top surface of the turn dial 310 is exposed to the outside through the hole formed through the top cover 361.

The present invention is not limited to the construction of a housing assembly 361, 355 and 365 shown in FIG. 7C. A housing assembly may be employed with the present invention if it allows the turn dial 310, to which the pattern wheel 320 is coupled, to be rotatably installed, and allows the LED 331 (for the light source 330) and the photodiode 341 (for the detector 340) to be fixedly installed for detecting the reflective sections and the non-reflective sections 323 and 325 of the pattern wheel 320.

While the present invention has been shown and described with reference to certain embodiments thereof, it will be understood by those skilled in the art that various changes in form and detail may be made therein without departing from the spirit and scope of the invention as defined by the appended claims.

What is claimed is:
1. A pattern wheel driver comprising:
a rotatable pattern wheel with patterned regions repeatedly formed on the pattern wheel, each of the patterned regions having a plurality of patterns, wherein each pattern of the plurality of patterns has a different width;
only a single photodiode configured to detect the plurality of patterns, the single photodiode mounted at a position where the patterned regions of the pattern wheel pass when the pattern wheel rotates; and an encoder configured to produce a signal indicating whether the pattern wheel rotates in a forward direction or a reverse direction based on signals produced by the only a single photodiode,
wherein each of the patterned regions has at least one of at least three reflective sections with differing widths or at least three non-reflective sections with differing widths.

2. The pattern wheel driver according to claim 1, wherein the plurality of patterns are formed by reflective sections which reflect light, and non-reflective sections which do not reflect light, the reflective sections and the non-reflective sections being alternately arranged, and wherein the single photodiode comprises a light source that emits light toward the patterned regions, and at least one light receiving part for detecting light reflected from the patterned regions.

3. The pattern wheel driver according to claim 1, further comprising a turn dial coupled to the pattern wheel.

4. The pattern wheel driver according to claim 3, further comprising a housing assembly for rotatably mounting the turn dial, wherein the single photodiode is fixed in the housing assembly so that it can detect the patterned regions of the pattern wheel.

5. The pattern wheel driver according to claim 1, wherein each of the patterned regions generates a different light-reflective pattern according to whether the pattern wheel rotates in a forward direction or a reverse direction.

6. The pattern wheel driver according to claim 2, wherein at least one light receiving part generates a different light-reflective pattern signal according to whether the pattern wheel rotates in a forward direction or a reverse direction by reflection of each patterned region.

7. A portable electronic device comprising:
a pattern wheel driver; and
a microprocessor configured to display information on a display based on a signal received from an encoder,
wherein the pattern wheel driver comprises:
a rotatable pattern wheel with patterned regions repeatedly formed on the pattern wheel, each of the patterned regions having a plurality of patterns, wherein each pattern of the plurality of patterns has a different width;
only a single photodiode configured to detect the plurality of patterns, the single photodiode mounted at a position where the patterned regions of the pattern wheel pass when the pattern wheel rotates;
the encoder configured to produce the signal indicating whether the pattern wheel rotates in a forward direction or a reverse direction based on signals produced by the single photodiode; and
a housing assembly configured to rotatably mount the turn dial, wherein the single photodiode is fixed in the housing assembly so that it can detect the patterned regions of the pattern wheel,
wherein each of the patterned regions has at least one of at least three reflective sections with differing widths or at least three non-reflective sections with differing widths.

8. The portable electronic device according to claim 7, wherein the information displayed on the display comprises at least one of a menu, a mouse pointer, and voice and image contents, which are provided by an operation system program of the portable electronic device.

9. The portable electronic device according to claim 7, wherein each of the patterned regions generates a different light-reflective pattern according to whether the pattern wheel rotates in a forward direction or a reverse direction.

10. The portable electronic device according to claim 7, wherein the plurality of patterns are formed by reflective sections which reflect light, and non-reflective sections which do not reflect light, the reflective sections and the non-reflective sections being alternately arranged, and wherein the single photodiode comprises a light source that emits light toward the patterned regions, and at least one receiving part for detecting light reflected from the patterned regions.

11. The portable electronic device according to claim 10, wherein at least one light receiving part generates a different light-reflective pattern signal according to whether the pattern wheel rotates in a forward direction or a reverse direction by reflection of each patterned region.

* * * * *